US012666790B2

(12) United States Patent

Ohchi

(10) Patent No.: US 12,666,790 B2
(45) Date of Patent: Jun. 23, 2026

(54) DISPLAY DEVICE, LIGHT-EMITTING DEVICE, AND ELECTRONIC APPARATUS

(71) Applicant: SONY SEMICONDUCTOR SOLUTIONS CORPORATION, Kanagawa (JP)

(72) Inventor: Tomokazu Ohchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 539 days.

(21) Appl. No.: 18/042,888

(22) PCT Filed: Sep. 6, 2021

(86) PCT No.: PCT/JP2021/032684
§ 371 (c)(1),
(2) Date: Feb. 24, 2023

(87) PCT Pub. No.: WO2022/054761
PCT Pub. Date: Mar. 17, 2022

(65) Prior Publication Data
US 2023/0309359 A1 Sep. 28, 2023

(30) Foreign Application Priority Data
Sep. 8, 2020 (JP) ................................. 2020-150756

(51) Int. Cl.
*H10K 50/00* (2023.01)
*H10K 50/816* (2023.01)
(Continued)

(52) U.S. Cl.
CPC ......... *H10K 50/818* (2023.02); *H10K 50/816* (2023.02); *H10K 59/80517* (2023.02); *H10K 59/80518* (2023.02)

(58) Field of Classification Search
CPC ............... H10K 50/818; H10K 50/816; H10K 59/80517; H10K 59/80518;
(Continued)

(56) References Cited

U.S. PATENT DOCUMENTS

| | | | | |
|---|---|---|---|---|
| 2001/0015256 A1* | 8/2001 | Yamazaki | .............. | H10D 86/40 |
| | | | | 156/289 |
| 2003/0168966 A1* | 9/2003 | Kobayashi | ........... | H10K 59/871 |
| | | | | 313/503 |

(Continued)

FOREIGN PATENT DOCUMENTS

| | | |
|---|---|---|
| CN | 109244274 A | 1/2019 |
| JP | 2011-243592 A | 12/2011 |

(Continued)

OTHER PUBLICATIONS

International Search Report and Written Opinion of PCT Application No. PCT/JP2021/032684, issued on Nov. 16, 2021, 11 pages of ISRWO.

*Primary Examiner* — Sheikh Maruf
(74) *Attorney, Agent, or Firm* — CHIP LAW GROUP

(57) ABSTRACT

Provided is a display device that includes a plurality of first electrodes; a second electrode facing the plurality of first electrodes and an organic light-emitting layer provided between the plurality of first electrodes and the second electrode. Each of the first electrode includes a metal layer having a main surface facing the organic light-emitting layer and a transparent electrode covering a main surface of the metal layer and a side surface of the metal layer and containing a transparent conductive oxide. The metal layer includes a first metal layer having a hydrogen absorption capacity and a second metal layer provided on the first metal layer and facing the organic light-emitting layer with the transparent electrode interposed therebetween. A peripheral (Continued)

edge of the first metal layer is separated from the transparent electrode.

15 Claims, 14 Drawing Sheets

(51) Int. Cl.
H10K 50/818 (2023.01)
H10K 59/80 (2023.01)

(58) Field of Classification Search
CPC .. H10K 2102/3026; G09F 9/30; H05B 33/12; H05B 33/22; H05B 33/26
USPC .......................................................... 257/40
See application file for complete search history.

(56) References Cited

U.S. PATENT DOCUMENTS

| | | | | |
|---|---|---|---|---|
| 2005/0084994 | A1* | 4/2005 | Yamazaki | H10K 59/80517 |
| | | | | 438/99 |
| 2005/0186698 | A1* | 8/2005 | Ishida | H10K 50/81 |
| | | | | 438/99 |
| 2007/0170846 | A1* | 7/2007 | Choi | H10K 50/8426 |
| | | | | 313/504 |
| 2010/0182523 | A1* | 7/2010 | Woo | G02F 1/13624 |
| | | | | 349/37 |
| 2010/0213460 | A1* | 8/2010 | Kondo | H10D 86/40 |
| | | | | 257/E29.296 |
| 2011/0069000 | A1* | 3/2011 | Su | H10K 50/818 |
| | | | | 345/76 |
| 2012/0061664 | A1* | 3/2012 | Yamazaki | H10K 59/1213 |
| | | | | 257/43 |
| 2012/0258575 | A1* | 10/2012 | Sato | H10D 30/6755 |
| | | | | 257/E21.409 |
| 2014/0175394 | A1* | 6/2014 | Kum | H10K 59/124 |
| | | | | 438/34 |
| 2014/0284575 | A1* | 9/2014 | Sugisawa | H10K 50/818 |
| | | | | 257/40 |
| 2015/0187857 | A1* | 7/2015 | Negishi | H10K 59/8792 |
| | | | | 257/40 |
| 2016/0197304 | A1* | 7/2016 | Kang | H10K 59/123 |
| | | | | 438/23 |
| 2016/0293887 | A1* | 10/2016 | Chen | H10K 50/818 |
| 2017/0040389 | A1* | 2/2017 | Lee | H10K 50/156 |
| 2017/0090246 | A1* | 3/2017 | Seo | H10K 50/17 |
| 2017/0187001 | A1* | 6/2017 | Fang | H10K 50/852 |
| 2021/0057504 | A1 | 2/2021 | Ko et al. | |
| 2021/0231300 | A1* | 7/2021 | Mei | G02B 6/0008 |
| 2023/0082560 | A1* | 3/2023 | Shin | H10H 20/854 |
| | | | | 257/79 |
| 2023/0403885 | A1* | 12/2023 | Kim | H10K 59/80517 |

FOREIGN PATENT DOCUMENTS

| | | |
|---|---|---|
| JP | 2014-203526 A | 10/2014 |
| WO | 2020/105433 A1 | 5/2020 |

* cited by examiner

Fig, 9A
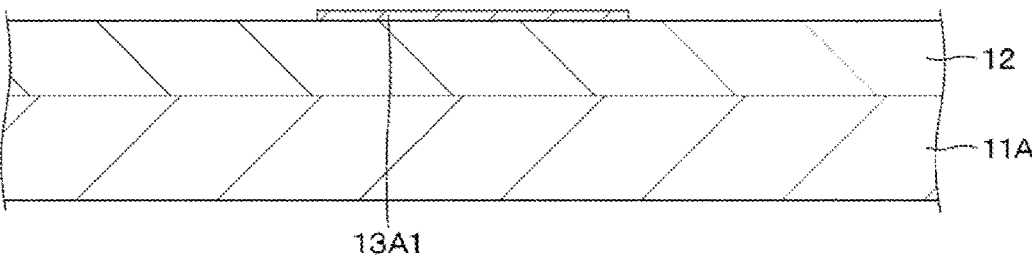
Fig, 9B
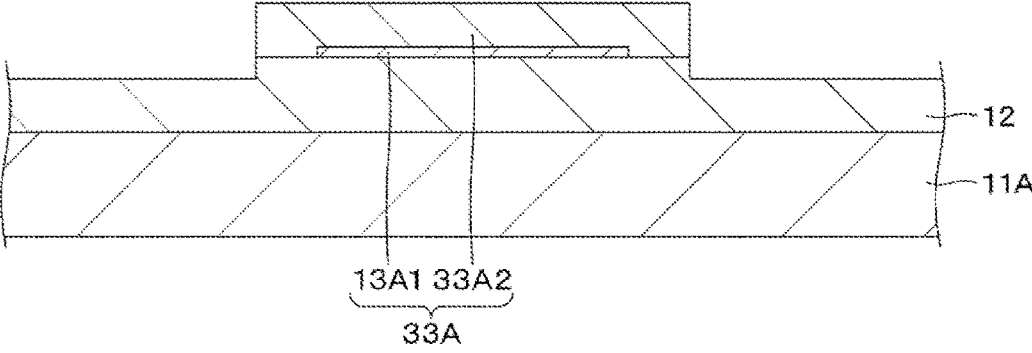
Fig, 9C
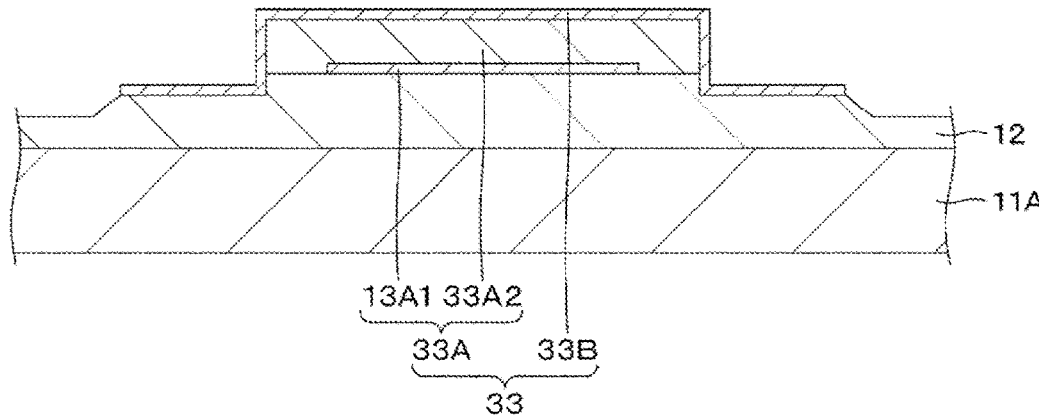

DISPLAY DEVICE, LIGHT-EMITTING DEVICE, AND ELECTRONIC APPARATUS

CROSS REFERENCE TO RELATED APPLICATIONS

This application is a U.S. National Phase of International Patent Application No. PCT/JP2021/032684 filed on Sep. 6, 2021, which claims priority benefit of Japanese Patent Application No. JP 2020-150756 filed in the Japan Patent Office on Sep. 8, 2020. Each of the above-referenced applications is hereby incorporated herein by reference in its entirety.

TECHNICAL FIELD

The present disclosure relates to display devices, light-emitting devices, and electronic apparatuses.

BACKGROUND ART

In recent years, organic EL (electroluminescence) display devices (hereinafter simply referred to as "display devices") have become widespread. This display device has a structure in which an organic light-emitting layer is provided between a first electrode and a second electrode. Various configurations have been proposed for the first electrode.

For example, PTL 1 (especially see FIG. 17) discloses that the first electrode includes a metal layer and a transparent electrode, and the transparent electrode covers the main surface of the metal layer and the side surfaces of the metal layer. In addition, the metal layer includes a first metal layer and a second metal layer, and the second metal layer is provided on the first metal layer to face the organic light-emitting layer with the transparent electrode interposed therebetween.

CITATION LIST

Patent Literature

[PTL 1]
WO 2020/105433

SUMMARY

Technical Problem

However, when the electrode disclosed in PTL 1 is used as the first electrode, there is a problem that the reliability of the display device is lowered.

An object of the present disclosure is to provide a display device, a light-emitting device, and an electronic apparatus capable of suppressing deterioration in reliability.

Solution to Problem

In order to solve the above problems, a first disclosure provides a display device including: a plurality of first electrodes; a second electrode facing the plurality of first electrodes; and an organic light-emitting layer provided between the plurality of first electrodes and the second electrode, wherein the first electrode includes: a metal layer having a main surface facing the organic light-emitting layer; and a transparent electrode covering a main surface of the metal layer and a side surface of the metal layer and containing a transparent conductive oxide, the metal layer includes: a first metal layer having a hydrogen absorption capacity; and a second metal layer provided on the first metal layer and facing the organic light-emitting layer with the transparent electrode interposed therebetween, and a peripheral edge of the first metal layer is separated from the transparent electrode.

A second disclosure provides a light-emitting device including: a first electrode; a second electrode facing the first electrode; and an organic light-emitting layer provided between the first electrode and the second electrode, wherein the first electrode includes: a metal layer having a main surface facing the organic light-emitting layer; and a transparent electrode covering a main surface of the metal layer and a side surface of the metal layer and containing a transparent conductive oxide, the metal layer includes: a first metal layer having a hydrogen absorption capacity; and a second metal layer provided on the first metal layer and facing the organic light-emitting layer with the transparent electrode interposed therebetween, and a peripheral edge of the first metal layer is separated from the transparent electrode.

A third disclosure provides an electronic apparatus including the display device of the first disclosure or the light-emitting device of the second disclosure.

BRIEF DESCRIPTION OF DRAWINGS

FIGS. 9A, 9B, and 9C are process diagrams for explaining an example of a method for manufacturing a display device according to the third embodiment of the present disclosure.

DESCRIPTION OF EMBODIMENTS

Figure 1:
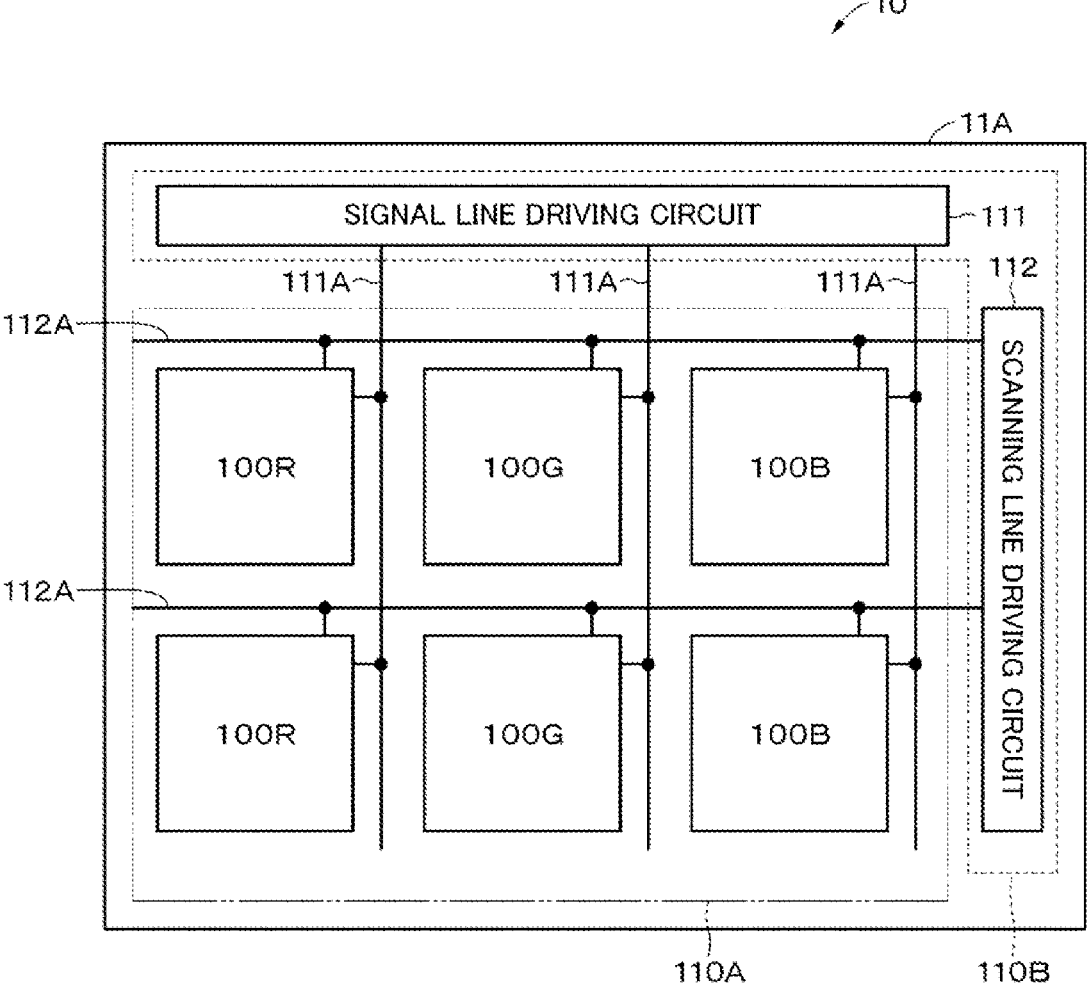
FIG. 1 is a schematic diagram showing an example of the overall configuration of a display device according to a first embodiment of the present disclosure.

An embodiment of the present disclosure will be described in the following order. In addition, in all drawings of the following embodiments, the same or corresponding parts are denoted by the same reference numerals.

1 First embodiment
1.1 Configuration of display device
1.2 Manufacturing method of display device
1.3 Operation and effect
2 Second embodiment
2.1 Configuration of display device
2.2 Manufacturing method of display device
2.3 Operation and effect
3 Third embodiment
3.1 Configuration of display device
3.2 Manufacturing method of display device
3.3 Operation and effect
4 Modification examples
5 Test example
6 Application example

1 First Embodiment

1.1 Configuration of Display Device

FIG. 1 is a schematic diagram showing an example of the overall configuration of a display device 10 according to the first embodiment of the present disclosure. The display device 10 has a display region 110A and a peripheral region 110B provided around the peripheral edge of the display region 110A. In the display region 110A, a plurality of sub-pixels 100R, 100G, and 100B are two-dimensionally arranged in a predetermined arrangement pattern such as a matrix. The pixel pitch of the sub-pixels 100 is preferably 10 μm or less from the viewpoint of achieving high definition of the display device 10.

The sub-pixel 100R displays red, the sub-pixel 100G displays green, and the sub-pixel 100B displays blue. In the following description, the sub-pixels 100R, 100G, and 100B are referred to as sub-pixels 100 when the sub-pixels are not particularly distinguished. A combination of adjacent sub-pixels 100R, 100G, and 100B constitutes one pixel. FIG. 1 shows an example in which a combination of three sub-pixels 100R, 100G, and 100B arranged in the row direction (horizontal direction) forms one pixel.

A signal line driving circuit 111 and a scanning line driving circuit 112, which are drivers for video display, are provided in the peripheral region 110B. The signal line driving circuit 111 supplies a signal voltage of a video signal corresponding to luminance information supplied from a signal supply source (not shown) to the selected sub-pixel 100 via a signal line 111A. The scanning line driving circuit 112 is configured by a shift register or the like that sequentially shifts (transfers) start pulses in synchronization with input clock pulses. The scanning line driving circuit 112 scans the sub-pixels 100 row by row when writing video signals to the sub-pixels 100, and sequentially supplies scanning signals to the scanning lines 112A.

The display device 10 is, for example, a microdisplay in which self-luminous elements such as OLED or Micro-OLED are formed in an array. The display device 10 is suitable for use as a display device for VR (Virtual Reality), MR (Mixed Reality) or AR (Augmented Reality), an electronic view finder (EVF), a small projector, or the like.

Figure 2A:
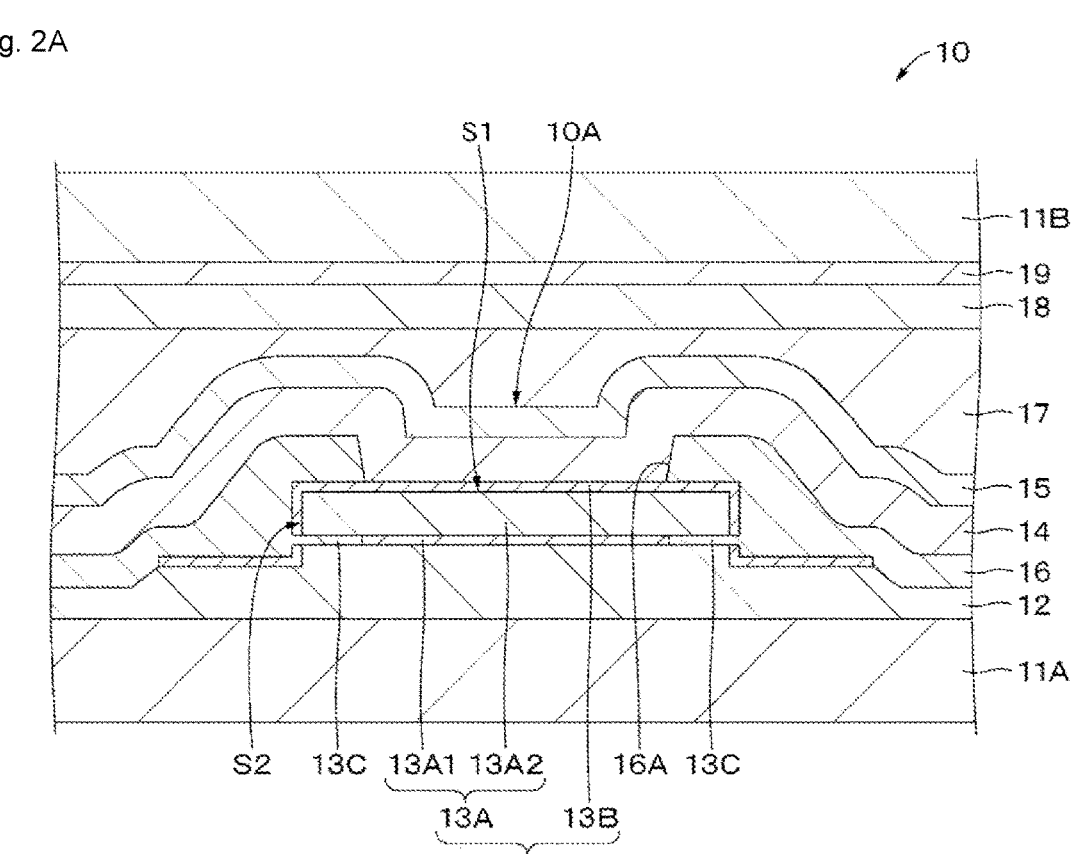
FIG. 2A is a cross-sectional view showing an example of the configuration of the display device according to the first embodiment of the present disclosure.

FIG. 2A is a cross-sectional view showing an example of the configuration of the display device 10 according to the first embodiment of the present disclosure. The display device 10 includes a driving substrate 11A, a first insulating layer 12, a plurality of first electrodes 13, an organic layer 14, a second electrode 15, a second insulating layer 16, a protective layer 17, a color filter 18, a filling resin layer 19, and a counter substrate 11B.

The display device 10 is an example of a light-emitting device. The display device 10 is a top-emission-type display device. The counter substrate 11B side is the top side, and the driving substrate 11A side is the bottom side. In the following description, in each layer constituting the display device 10, the top surface of the display device 10 is referred to as a first surface, and the bottom surface of the display device 10 is referred to as a second surface.

The display device 10 includes a plurality of light-emitting elements 10A. The light-emitting element 10A is composed of the first electrode 13, the organic layer 14, and the second electrode 15. The light-emitting element 10A is a white OLED or white Micro-OLED (MOLED). As a method of colorization in the display device 10, a method using a white OLED and the color filter 18 is used. However, the colorization method is not limited to this, and an RGB coloring method or the like may be used.

(Driving Substrate)

The driving substrate 11A is a so-called backplane and drives the plurality of light-emitting elements 10A. A driving circuit including sampling transistors and driving transistors for controlling driving of the plurality of light-emitting elements 10A and a power supply circuit for supplying electric power to the plurality of light-emitting elements 10A (both not shown) are provided on the first surface of the driving substrate 11A.

The driving substrate 11A may be made of, for example, glass or resin having low moisture and oxygen permeability, or may be made of a semiconductor that facilitates formation of transistors and the like. Specifically, the driving substrate 11A may be a glass substrate, a semiconductor substrate, a resin substrate, or the like. Glass substrates include, for example, high strain-point glass, soda glass, borosilicate glass, forsterite, lead glass, or quartz glass. Semiconductor substrates include, for example, amorphous silicon, polycrystalline silicon, monocrystalline silicon, or the like. The resin substrate contains, for example, at least one selected from the group consisting of polymethyl methacrylate, polyvinyl alcohol, polyvinyl phenol, polyethersulfone, polyimide, polycarbonate, polyethylene terephthalate and polyethylene naphthalate.

(First Insulating Layer)

The first insulating layer 12 is provided on the first surface of the driving substrate 11A and covers the driving circuit, the power supply circuit, and the like. The first insulating layer 12 includes a plurality of contact plugs (not shown) and wirings. The contact plug connects the light-emitting element 10A and the driving circuit or wirings. The contact plug connects the wirings and the driving circuit.

The first insulating layer 12 is made of, for example, an organic material or an inorganic material. The organic material includes, for example, at least one selected from the group consisting of polyimide, acrylic resin, and the like. The inorganic material includes, for example, at least one selected from the group consisting of silicon oxide, silicon nitride, silicon oxynitride and aluminum oxide.

(First Electrode)

The plurality of first electrodes 13 are provided on the first surface of the first insulating layer 12. The first electrode 13 is the anode. When a voltage is applied between the first electrode 13 and the second electrode 15, holes are injected into the organic layer 14 from the first electrode 13. Adjacent first electrodes 13 are electrically isolated. The first electrode 13 is connected to a contact plug provided on the first insulating layer 12. The first electrode 13 is connected to the driving circuit or wirings through this contact plug.

Figure 2B:
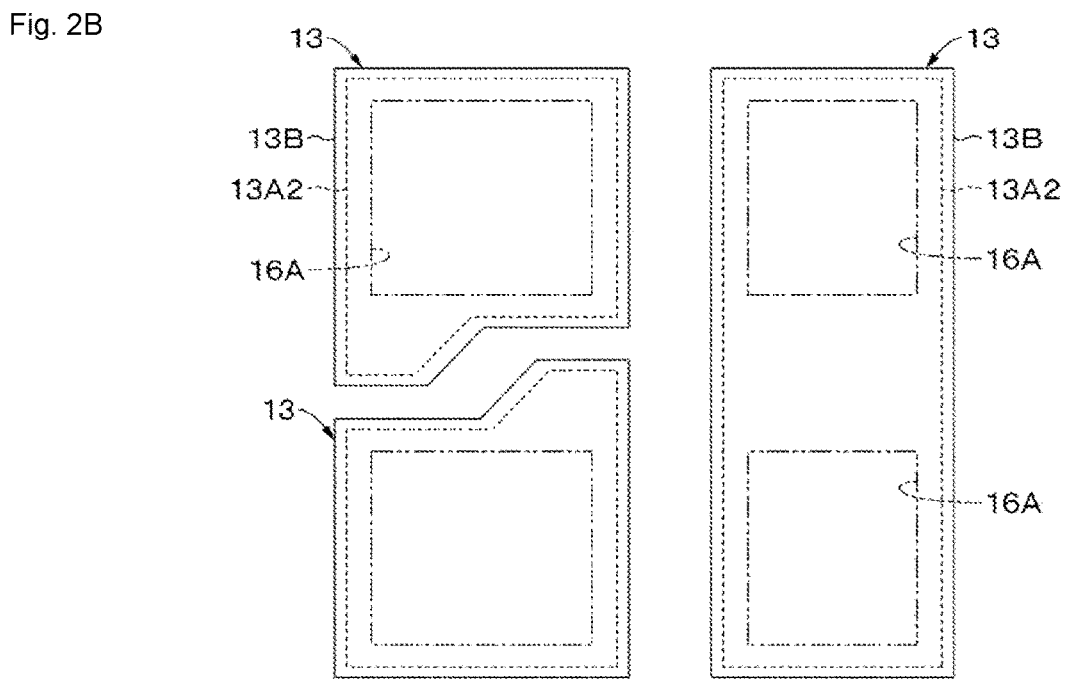
FIG. 2B is a plan view showing an example of the configuration of the first electrode.
Figure 3A:
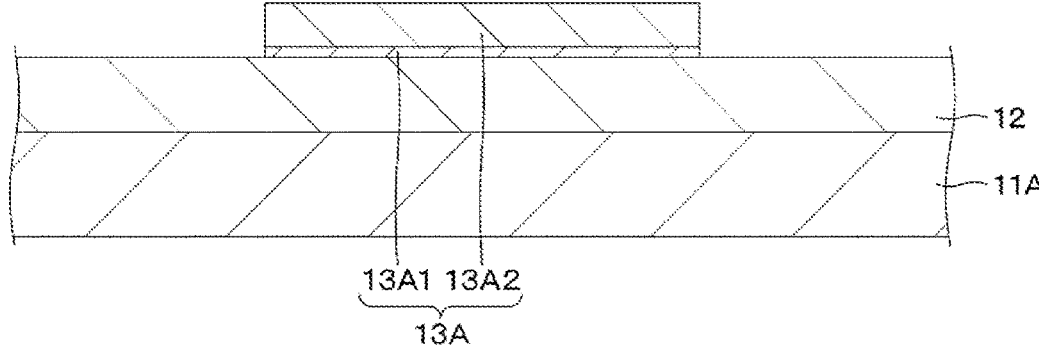
FIGS. 3A, 3B, and 3C are process diagrams for explaining an example of the method for manufacturing the display device according to the first embodiment of the present disclosure.
Figure 3B:
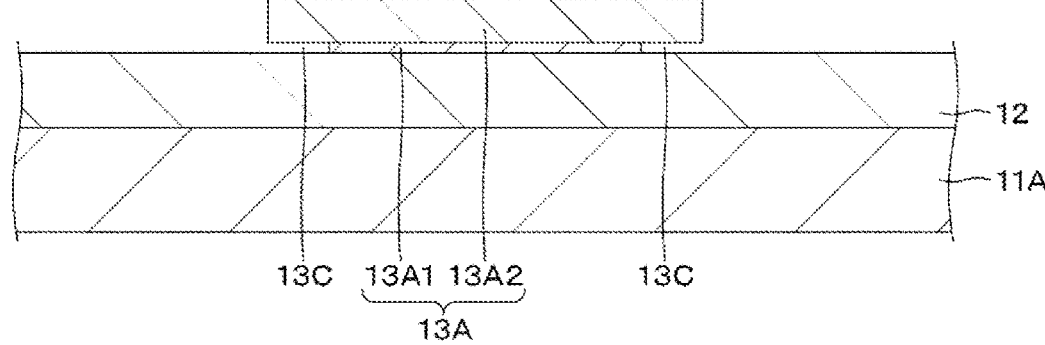
Figure 3C:
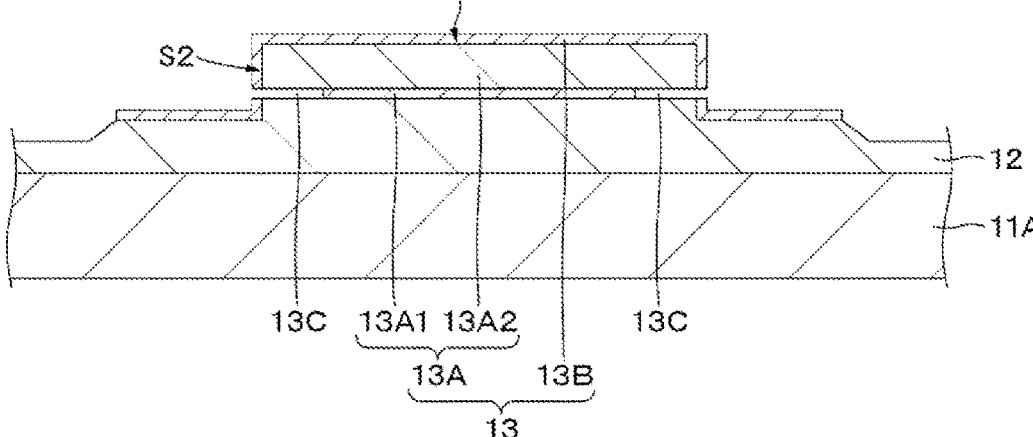

FIG. 2B is a plan view showing an example of the configuration of the first electrode 13. The first electrode 13 includes a metal layer 13A and a transparent electrode 13B.

(Metal Layer)

The metal layer 13A functions as a reflective layer that reflects light emitted from the organic layer 14. The metal layer 13A has a first surface (main surface) S1 and side surfaces S2, and the first surface S1 faces the organic layer 14. The metal layer 13A includes a first metal layer 13A1 and a second metal layer 13A2.

(First Metal Layer)

The first metal layer 13A1 is provided between the first insulating layer 12 and the second metal layer 13A2. The first metal layer 13A1 improves the crystal orientation of the second metal layer 13A2 when forming the second metal layer 13A2. As a result, the unevenness of the surface (first surface) of the second metal layer 13A2 can be reduced. The first metal layer 13A1 has hydrogen absorption capacity. The second surface of the first metal layer 13A1 is connected to a contact plug provided in the first insulating layer 12.

The periphery of the first metal layer 13A1 is separated from the transparent electrode 13B and is not in contact with the transparent electrode 13B. In this way, it is possible to suppress the generation of moisture due to the oxidation-reduction reaction between the first metal layer 13A1 and the transparent electrode 13B. In the in-plane direction of the driving substrate 11A (that is, the in-plane direction of the display device 10), the peripheral edge of the first metal layer 13A1 is positioned on the inner side than the peripheral edge of the second metal layer 13A2. A gap 13C is provided outside the side surface of the first metal layer 13A1. More specifically, the gap 13C is provided between the peripheral portion of the second surface of the second metal layer 13A2 and the first surface of the first insulating layer 12. In the present specification, the peripheral portion of the second surface refers to a region having a predetermined width toward the inner side from the peripheral edge of the second surface.

An insulating layer or a metal layer may be provided in the gap 13C, or the gap 13C may be hollow. The hydrogen absorption capacity of the insulating layer or metal layer provided in the gap 13C is lower than that of the first metal layer 13A1. It is preferable that the insulating layer or metal layer provided in the gap 13C does not have hydrogen absorption capacity. The constituent material of the insulating layer provided in the gap 13C may be the same as or different from the insulating material forming the second insulating layer 16. The constituent material of the metal layer provided in the gap 13C may be the same as or different from that of the second metal layer 13A2.

The first metal layer 13A1 contains, for example, at least one metal element selected from the group consisting of titanium (Ti) and tantalum (Ta). The first metal layer 13A1 may contain the at least one metal element as a constituent element of an alloy.

(Second Metal Layer)

The second metal layer 13A2 is provided on the first surface of the first metal layer 13A1. The second metal layer 13A2 faces the organic layer 14 with the transparent electrode 13B interposed therebetween. The second metal layer 13A2 functions as a reflective layer that reflects light emitted from the organic layer 14. The hydrogen absorption capacity of the second metal layer 13A2 is lower than that of the first metal layer 13A1. The second metal layer 13A2 preferably does not have hydrogen absorption capacity.

The second metal layer 13A2 contains at least one metal element selected from the group consisting of, for example, aluminum (Al), silver (Ag), chromium (Cr), gold (Au), platinum (Pt), nickel (Ni), copper (Cu), molybdenum (Mo), magnesium (Mg), iron (Fe) and tungsten (W). The second metal layer 13A2 may contain the at least one metal element as a constituent element of an alloy. Specific examples of alloys include aluminum alloys and silver alloys. Specific examples of aluminum alloys include AlNd and AlCu. From the viewpoint of improving the reflectance, the second metal layer 13A2 preferably contains at least one metal element selected from the group consisting of aluminum (Al) and silver (Ag) among the above metal elements.

(Transparent Electrode)

The transparent electrode 13B is provided on the first surface (main surface) S1 of the metal layer 13A and covers the first surface S1 of the metal layer 13A and the side surface S2 of the metal layer 13A. The transparent electrode 13B may be divided by the gap 13C. The work function of the transparent electrode 13B is preferably higher than the work function of the second metal layer 13A2. In this case, since the transparent electrode 13B is provided on the second metal layer 13A2, hole injection from the first electrode 13 to the organic layer 14 can be improved. The transparent electrode 13B preferably has a high transmittance from the viewpoint of improving luminous efficiency.

The transparent electrode 13B contains a transparent conductive oxide (TCO). The transparent conductive oxides include at least one selected from the group consisting of, for example, transparent conductive oxides containing indium (hereinafter referred to as "indium-based transparent conductive oxides"), transparent conductive oxides containing tin (hereinafter referred to as "tin-based transparent conductive oxides") and transparent conductive oxides containing zinc (hereinafter referred to as "zinc-based transparent conductive oxides").

Indium-based transparent conductive oxides include, for example, indium tin oxide (ITO), indium zinc oxide (IZO), indium gallium oxide (IGO) or indium gallium zinc oxide (IGZO) fluorine-doped indium oxide (IFO). Among these transparent conductive oxides, indium tin oxide (ITO) is particularly preferred. This is because indium tin oxide (ITO) has a particularly low hole injection barrier to the organic layer 14 in terms of work function, so that the driving voltage of the display device 10 can be particularly reduced. Tin-based transparent conductive oxides include, for example, tin oxide, antimony-doped tin oxide (ATO), or fluorine-doped tin oxide (FTO). Zinc-based transparent conductive oxides include, for example, zinc oxide, aluminum-doped zinc oxide (AZO), boron-doped zinc oxide, or gallium-doped zinc oxide (GZO).

(Second Electrode)

The second electrode 15 is provided so as to face the first electrode 13. The second electrode 15 is provided as a common electrode for all sub-pixels 100 within the display region 110A. The second electrode 15 is the cathode. When a voltage is applied between the first electrode 13 and the second electrode 15, electrons are injected from the second electrode 15 into the organic layer 14. The second electrode 15 is a transparent electrode that is transparent to light generated in the organic layer 14. Here, the transparent electrode includes a semi-transmissive reflective layer. The second electrode 15 is preferably made of a material having as high transmittance as possible and a small work function, in order to increase the luminous efficiency.

The second electrode 15 is composed of, for example, at least one layer of a metal layer and a transparent electrode. More specifically, the second electrode 15 is composed of a single layer film of a metal layer or a transparent electrode, or a laminated film of a metal layer and a transparent electrode. When the second electrode 15 is composed of a laminated film, the metal layer may be provided on the organic layer 14 side, and the transparent electrode may be provided on the organic layer 14 side. However, from the viewpoint of placing a layer with a low work function adjacent to the organic layer 14, the metal layer is preferably provided on the organic layer 14 side.

The metal layer contains, for example, at least one metal element selected from the group consisting of magnesium (Mg), aluminum (Al), silver (Ag), calcium (Ca) and sodium (Na). The metal layer may contain the at least one metal element as a constituent element of an alloy. Specific examples of alloys include MgAg alloys, MgAl alloys, AlLi alloys, and the like. A transparent electrode contains a transparent conductive oxide. Examples of the transparent conductive oxide include the same materials as those of the transparent electrode 13B described above.

(Organic Layer)

The organic layer 14 is provided between the plurality of first electrodes 13 and the second electrode 15. The organic layer 14 is provided as an organic layer common to all sub-pixels 100 within the display region 110A. The organic layer 14 is configured to emit white light.

The organic layer 14 has a configuration in which a hole injection layer, a hole transport layer, a light-emitting layer, and an electron transport layer are laminated in this order from the first electrode 13 toward the second electrode 15. The configuration of the organic layer 14 is not limited to this, and layers other than the light-emitting layer are provided as necessary.

The hole injection layer is a buffer layer for increasing the efficiency of hole injection into the light-emitting layer and suppressing leakage. The hole transport layer is provided for increasing the efficiency of transporting holes to the light-emitting layer. In the light-emitting layer, the application of an electric field causes recombination of electrons and holes, thereby generating light. The light-emitting layer is an organic light-emitting layer containing an organic light-emitting material. The electron transport layer is provided for increasing the efficiency of transporting electrons to the light-emitting layer. An electron injection layer may be provided between the electron transport layer and the second electrode 15. This electron injection layer is for enhancing the electron injection efficiency.

(Second Insulating Layer)

The second insulating layer 16 is provided on the first surface of the first insulating layer 12. The second insulating layer 16 is provided between the adjacent first electrodes 13 and electrically isolates the adjacent first electrodes 13. The second insulating layer 16 has a plurality of openings 16A. The plurality of openings 16A are provided so as to correspond to the respective sub-pixels 100. The opening 16A exposes the first surface of the first electrode 13 (the surface facing the second electrode 15). The first electrode 13 and the organic layer 14 are in contact with each other through the opening 16A. One opening 16A may be provided for one first electrode 13, or two openings 16A may be provided for one first electrode 13 (see FIG. 2B).

The second insulating layer 16 may cover a region extending from the peripheral portion of the first surface of the first electrode 13 to the side surface (end surface) of the first electrode 13. In the present specification, the peripheral portion of the first surface refers to a region having a predetermined width toward the inner side from the peripheral edge of the first surface. Part of the insulating material forming the second insulating layer 16 may enter the gap 13C provided between the second insulating layer 16 and the second metal layer 13A2.

In the in-plane direction of the driving substrate 11A (that is, the in-plane direction of the display device 10), the peripheral edge of the first metal layer 13A1 is preferably positioned on the outer side of the opening 16A of the second insulating layer 16. As a result, deterioration of the crystal orientation of the portion of the second metal layer 13A2 corresponding to the opening 16A can be suppressed. Therefore, the unevenness of the portion of the first surface of the second metal layer 13A2 exposed from the opening 16A (that is, the portion of the first surface of the second metal layer 13A2 that contacts the organic layer 14) can be reduced.

As a constituent material of the second insulating layer 16, the same material as that of the above-described first insulating layer 12 can be exemplified.

(Protective Layer)

The protective layer 17 is provided on the first surface of the second electrode 15 and covers the plurality of light-emitting elements 10A. The protective layer 17 shields the light-emitting element 10A from the outside air, and suppresses the intrusion of moisture from the external environment into the light-emitting element 10A. Moreover, when the second electrode 15 is composed of a metal layer, the protective layer 17 may have a function of suppressing oxidation of this metal layer.

The protective layer 17 contains, for example, an inorganic material with low hygroscopicity. The inorganic material includes, for example, at least one of silicon oxide (SiO), silicon nitride (SiN), silicon oxynitride (SiNO), titanium oxide (TiO) and aluminum oxide (AlO). The protective layer 17 may have a single-layer structure, but may have a multi-layer structure when the thickness of the protective layer 17 is increased. This is for alleviating the internal stress in the protective layer 17. The protective layer 17 may be made of polymer resin. The polymer resin includes at least one selected from the group consisting of thermosetting resins, ultraviolet curing resins, and the like.

(Color Filter)

The color filter 18 is provided on the first surface of the protective layer 17. The color filter 18 is, for example, an on-chip color filter (OCCF). The color filter 18 includes, for example, a red filter, a green filter and a blue filter. The red filter, green filter, and blue filter are provided to face the light-emitting element 10A for the red sub-pixel 100R, the light-emitting element 10A for the green sub-pixel 100G, and the light-emitting element 10A for the blue sub-pixel 100B, respectively. The sub-pixels 100R, 100G, and 100B are thus configured.

White light emitted from each light-emitting element 10A in the sub-pixels 100R, 100G, and 100B is transmitted through the red, green, and blue filters, respectively, so that the red, green, and blue lights are emitted from the display surface. A light shielding layer (not shown) may be provided in the region between the color filters of each color, that is, between the sub-pixels. The color filters 18 are not limited to on-chip color filters, and may be provided on one main surface of the counter substrate 11B.

(Filling Resin Layer)

The filling resin layer 19 is provided between the color filter 18 and the counter substrate 11B. The filling resin layer 19 functions as an adhesive layer that bonds the color filter 18 and the counter substrate 11B. The filling resin layer 19 contains, for example, at least one selected from the group consisting of thermosetting resins, ultraviolet curing resins, and the like.

(Counter Substrate)

The counter substrate 11B is provided to face the driving substrate 11A. More specifically, the counter substrate 11B is provided such that the second surface of the counter substrate 11B faces the first surface of the driving substrate 11A. The counter substrate 11B and the filling resin layer 19 seal the light-emitting element 10A, the color filter 18, and the like. The counter substrate 11B is made of a material such as glass that is transparent to each color light emitted from the color filter 18.

1.2 Manufacturing Method of Display Device

An example of a method for manufacturing the display device 10 according to the first embodiment of the present disclosure will be described below with reference to FIGS. 3A, 3B, 3C, 4A, 4B, and 4C.

First, a driving circuit, a power supply circuit, and the like are formed on the first surface of the driving substrate 11A using, for example, thin film formation technology, photolithography technology, and etching technology. Next, the first insulating layer 12 is formed on the first surface of the driving substrate 11A so as to cover the driving circuit, the power supply circuit, and the like by, for example, a CVD (Chemical Vapor Deposition) method. At this time, a plurality of contact plugs, a plurality of wirings, and the like are formed in the first insulating layer 12.

Next, the first metal layer 13A1 is formed on the first surface of the first insulating layer 12 by, for example, sputtering. Subsequently, the second metal layer 13A2 is formed on the first surface of the first metal layer 13A1 by, for example, sputtering. Next, after forming a resist mask having a predetermined pattern on the first surface of the second metal layer 13A2, the first metal layer 13A1 and the second metal layer 13A2 are patterned by dry-etching the first metal layer 13A1 and the second metal layer 13A2 through the resist mask (see FIG. 3A). In this way, a plurality of patterned metal layers 13A are formed on the first surface of the first insulating layer 12.

Next, by wet-etching, for example, the peripheral edge of the first metal layer 13A1 is recessed from the peripheral edge of the first metal layer 13A1 toward the center. As a result, the peripheral edge of the first metal layer 13A1 is positioned on the inner side than the peripheral edge of the second metal layer 13A2 in the in-plane direction of the driving substrate 11A, and the gap 13C is formed between the peripheral portion of the second surface of the second metal layer 13A2 and the first surface of the first insulating layer 12 (see FIG. 3B). As a chemical solution for wet etching, it is preferable to use a solution that provides a large etching selectivity of the first metal layer 13A1 to the second metal layer 13A2 ((etching rate of the first metal layer 13A1)/(etching rate of the second metal layer 13A2)) and can selectively etch the first metal layer 13A1. As a chemical solution for wet etching, one that does not corrode the second metal layer 13A2 is preferable.

Next, the transparent electrode 13B is formed on the first surface of the first insulating layer 12 so as to cover the plurality of metal layers 13A by sputtering, for example. At this time, the transparent electrode 13B may be divided by the gap 13C. A structure in which the transparent electrode 13B covers the entire metal layer 13A (that is, a structure in which the side surface S2 of the metal layer 13A as well as the first surface S1 of each metal layer 13A are covered) is preferable. In this way, it is possible to suppress dissolution of each metal layer 13A with a developer when forming a resist mask for the transparent electrode 13B. Next, after forming a resist mask having a predetermined pattern on the first surface of the transparent electrode 13B, the transparent electrode 13B is patterned by dry-etching the transparent electrode 13B through the resist mask. In this way, a plurality of first electrodes 13 are formed on the first surface of the first insulating layer 12 (see FIG. 3C).

Next, the second insulating layer 16 is formed on the first surface of the first insulating layer 12 so as to cover the plurality of first electrodes 13 by, for example, CVD. Thereafter, after forming a resist mask having a predetermined pattern on the first surface of the second insulating layer 16, a plurality of openings 16A is formed in the second insulating layer 16 by etching the second insulating layer 16 through the resist mask (see FIG. 4A).

Figure 4A:
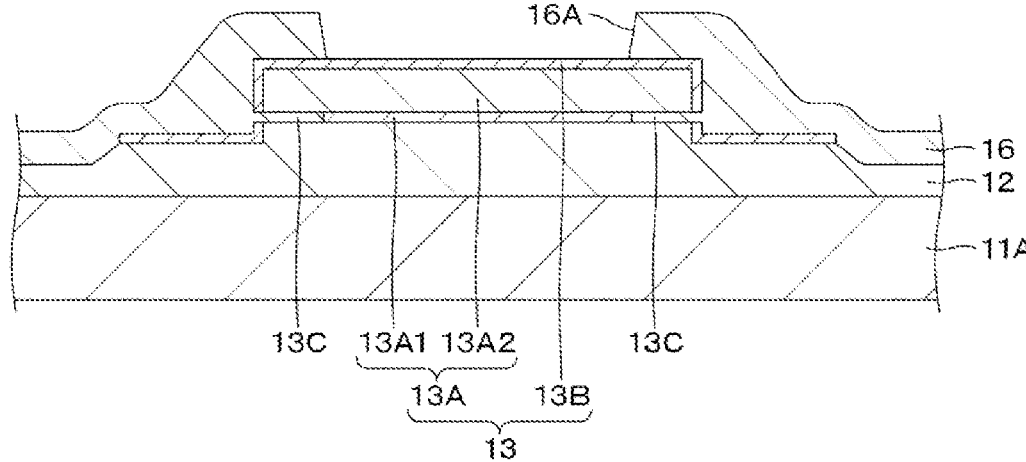
FIGS. 4A, 4C, and 4C are process diagrams for explaining an example of the method for manufacturing the display device according to the first embodiment of the present disclosure.
Figure 4B:
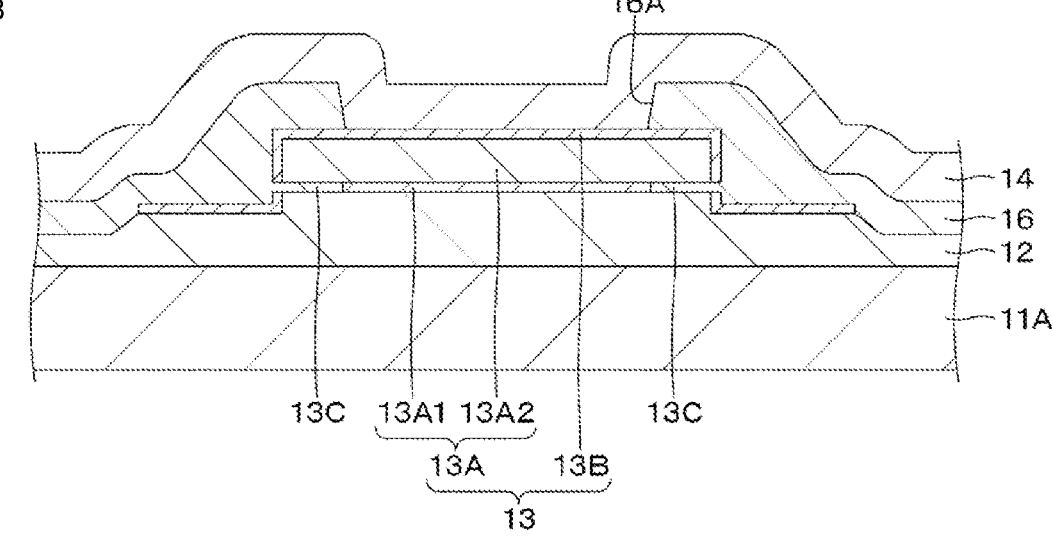
Figure 4C:
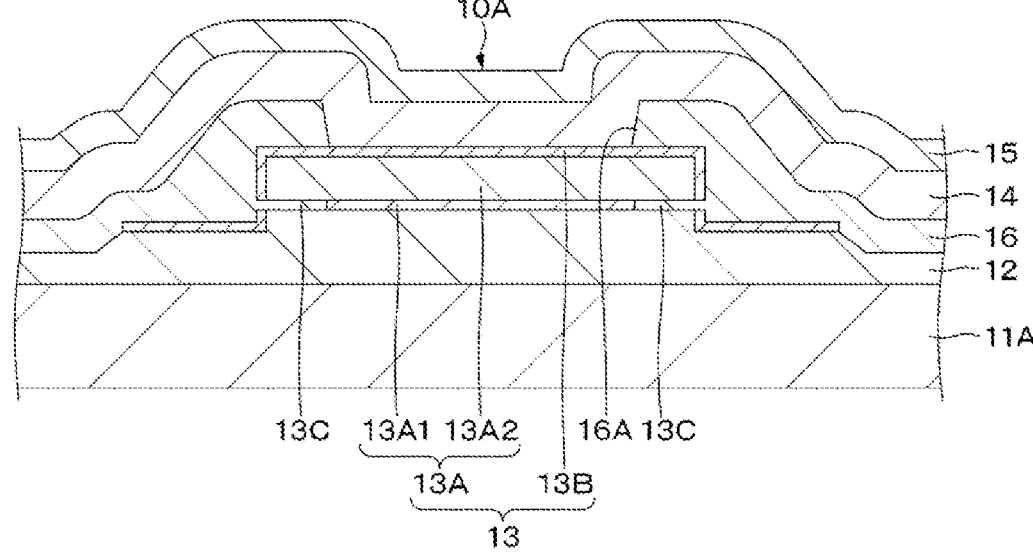

Next, the organic layer 14 is formed by laminating a hole injection layer, a hole transport layer, a light-emitting layer, and an electron transport layer in this order on the first surface of the first electrode 13 and the first surface of the second insulating layer 16 by vapor deposition, for example (see FIG. 4B). Next, the second electrode 15 is formed on the first surface of the organic layer 14 by vapor deposition or sputtering, for example. In this way, a plurality of light-emitting elements 10A are formed on the first surface of the first insulating layer 12 (see FIG. 4C).

Next, after forming a protective layer 17 on the first surface of the second electrode 15 by, for example, CVD or vapor deposition, a color filter 18 is formed on the first surface of the protective layer 17 by, for example, photolithography. A planarization layer may be formed above, below, or both above and below the color filter 18 in order to planarize the step of the protective layer 17 and the step due to the film thickness difference of the color filter 18 itself. Next, after covering the color filter 18 with the filling resin layer 19 using, for example, the ODF (One Drop Fill) method, the counter substrate 11B is placed on the filling resin layer 19. Next, for example, by applying heat to the filling resin layer 19 or irradiating the filling resin layer 19 with ultraviolet rays to harden the filling resin layer 19, the driving substrate 11A and the counter substrate 11B are bonded together with the filling resin layer 19 interposed therebetween. In this way, the display device 10 is sealed. In this way, the display device 10 shown in FIGS. 1 and 2A is obtained.

1.3 Operation and Effect

In order to facilitate understanding of the operation and effect of the display device 10 according to the first embodiment, the operation and effect of the display device 10 will be described by comparing the configuration of the display device 410 according to the reference example with the configuration of the display device 10 according to the first embodiment.

Figure 5:
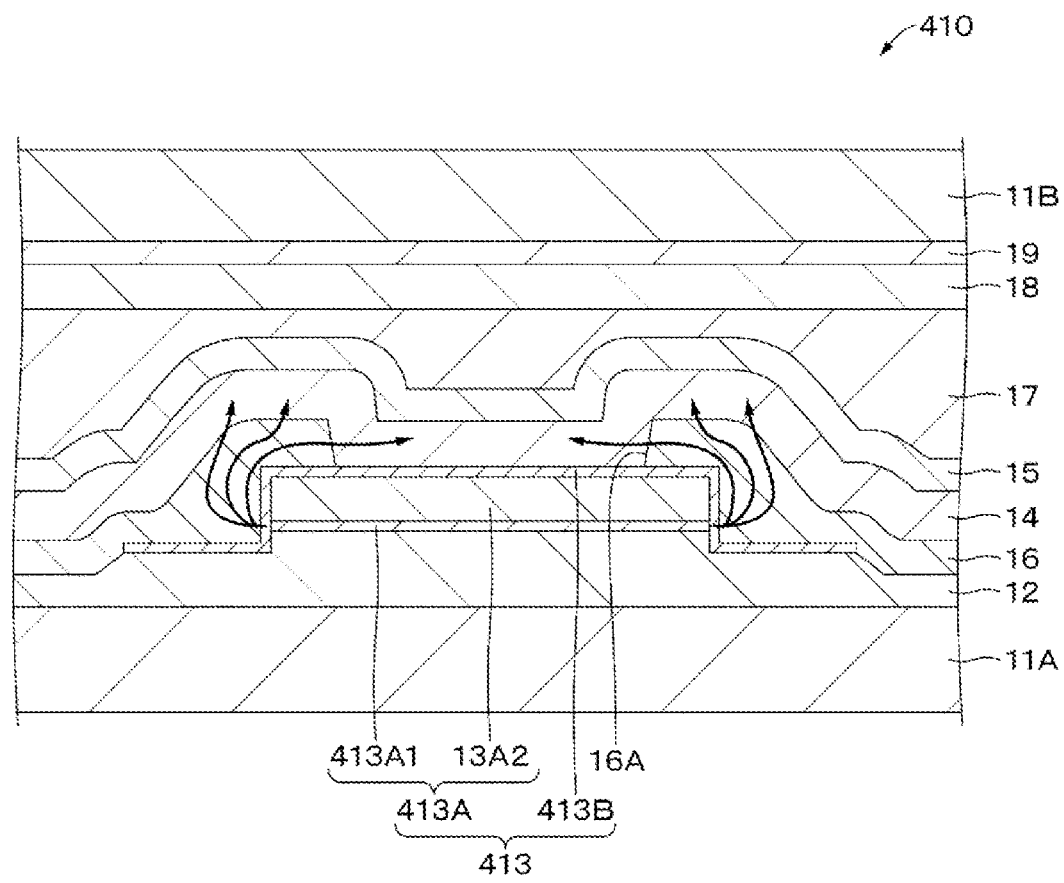
FIG. 5 is a cross-sectional view showing the configuration of a display device according to a reference example.

FIG. 5 is a cross-sectional view showing the configuration of a display device 410 according to a reference example. In the display device 410 according to the reference example, a first electrode 413 includes a metal layer 413A and a transparent electrode 413B. A peripheral edge of a first metal layer 413A1 included in the metal layer 413A is in contact with the transparent electrode 413B. Since the constituent material of the first metal layer 413A1 has a hydrogen absorption capacity, hydrogen usually remains in the first metal layer 413A1 during and after the display device 410 is manufactured. Therefore, when the first metal layer 413A1 is in contact with the transparent electrode 413B as described above, an oxidation-reduction reaction occurs between the first metal layer 413A1 and the transparent electrode 413B at the contact portion, and moisture is generated. When the generated moisture permeates through the second insulating layer 16 and reaches the organic layer 14 as indicated by the arrows in FIG. 5, the organic layer 14 deteriorates. Therefore, the reliability of the display device 410 is lowered. Moisture generation due to oxidation-reduction reaction occurs, for example, when the transparent electrode 413B is formed in the manufacturing process of the display device 410 and when the first electrode 413 is heated in the manufacturing process of the display device 410.

It is thought that the effect of the moisture generation will become remarkable because the ratio of the contact area (the contact area between the first metal layer 413A1 and the transparent electrode 413B) to the light-emitting region increases when pixels are made to have high definition (for example, the sub-pixel pitch is made to be 10 μm or less).

In addition, abnormal growth of the transparent electrode 413B occurs at the contact portion between the first metal layer 413A1 and the transparent electrode 413B. Abnormal light emission occurs at a location where such abnormal growth occurs. The abnormal growth is considered to be caused by indium agglomeration.

In contrast, in the display device 10 according to the first embodiment, the peripheral edge of the first metal layer 13A1 included in the metal layer 13A is separated from the transparent electrode 13B. In this way, it is possible to suppress the generation of moisture due to the oxidation-reduction reaction between the first metal layer 13A1 and the transparent electrode 13B. Therefore, deterioration in reliability of the organic layer 14 due to moisture can be suppressed. Therefore, deterioration in reliability of the display device 10 can be suppressed.

Moreover, it is possible to suppress the occurrence of abnormal growth of the transparent electrode 13B at the contact portion between the first metal layer 13A1 and the transparent electrode 13B. Therefore, it is possible to suppress the occurrence of abnormal light emission.

2 Second Embodiment

2.1 Configuration of Display Device

Figure 6:
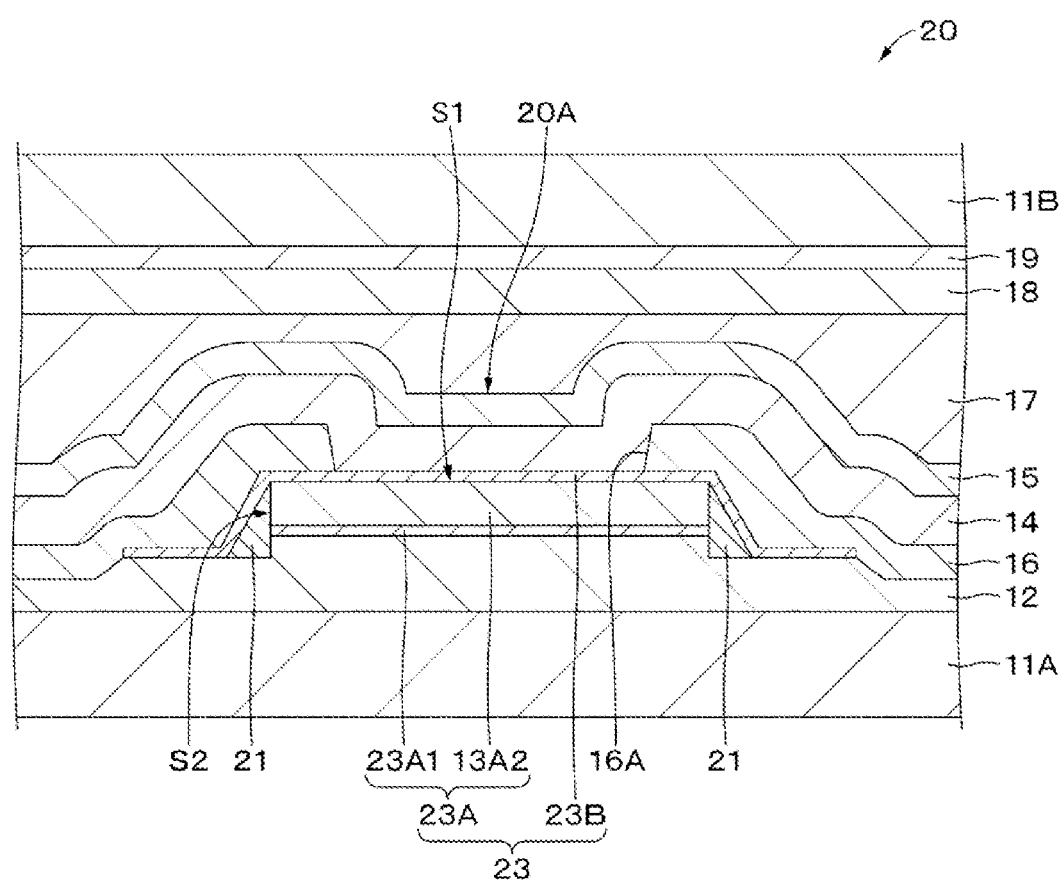
FIG. 6 is a cross-sectional view showing an example of the configuration of the display device according to a second embodiment of the present disclosure.

FIG. 6 is a cross-sectional view showing an example of the configuration of a display device 20 according to a second embodiment of the present disclosure. The display device 20 includes a first electrode 23 instead of the first electrode 13 (see FIG. 2A) in the first embodiment. The display device 20 also includes a plurality of sidewalls 21. The first electrode 23, the organic layer 14, and the second electrode 15 constitute a light-emitting element 20A. In the second embodiment, the same parts as those in the first embodiment are denoted by the same reference numerals, and descriptions thereof will be omitted.

(First Electrode)

The first electrode 23 includes a metal layer 23A and a transparent electrode 23B. The metal layer 23A includes a first metal layer 23A1 and a second metal layer 13A2. The peripheral edge of the first metal layer 23A1 and the peripheral edge of the second metal layer 13A2 are aligned in the thickness direction of the first electrode 23. However, the configuration of the metal layer 23A is not limited to this, and the peripheral edge of the first metal layer 23A1 may be positioned on the inner side of the peripheral edge of the second metal layer 13A2 in the in-plane direction of the driving substrate 11A. Alternatively, the peripheral edge of the first metal layer 23A1 may be positioned on the outer side of the peripheral edge of the second metal layer 13A2. The transparent electrode 23B covers the first surface S1 and the sidewalls 21 of the metal layer 23A.

(Sidewall)

The plurality of sidewalls 21 are provided on the first surface of the first insulating layer 12. The sidewall 21 surrounds the metal layer 23A and covers the side surface S2 of the metal layer 23A. FIG. 6 shows an example in which the sidewall 21 covers the entire side surface S2 of the metal layer 23A, but it is sufficient if it covers at least the side surface of the first metal layer 13A1. The sidewall 21 is provided between the side surface S2 of the metal layer 23A and the transparent electrode 23B.

In order to suppress the generation of moisture due to the oxidation-reduction reaction, the sidewalls 21 preferably have lower hydrogen absorption capacity than the first metal layer 13A1, and more preferably, the sidewalls 21 do not have the hydrogen absorption capacity.

The sidewalls 21 contain, for example, at least one selected from the group consisting of metals, insulating materials, and the like. As the metal, the same material as that of the second metal layer 13A2 can be exemplified. As the insulating material, the same material as that of the first insulating layer 12 can be exemplified.

2.2 Manufacturing Method of Display Device

An example of a method for manufacturing the display device 20 according to the second embodiment of the present disclosure will be described below with reference to FIGS. 7A, 7B, and 7C.

First, the steps up to the etching of the first metal layer 23A1 and the second metal layer 13A2 are performed in the same manner as in the method of manufacturing the display device 10 according to the first embodiment. In this way, a plurality of patterned metal layers 23A are formed on the first surface of the first insulating layer 12.

Figure 7A:
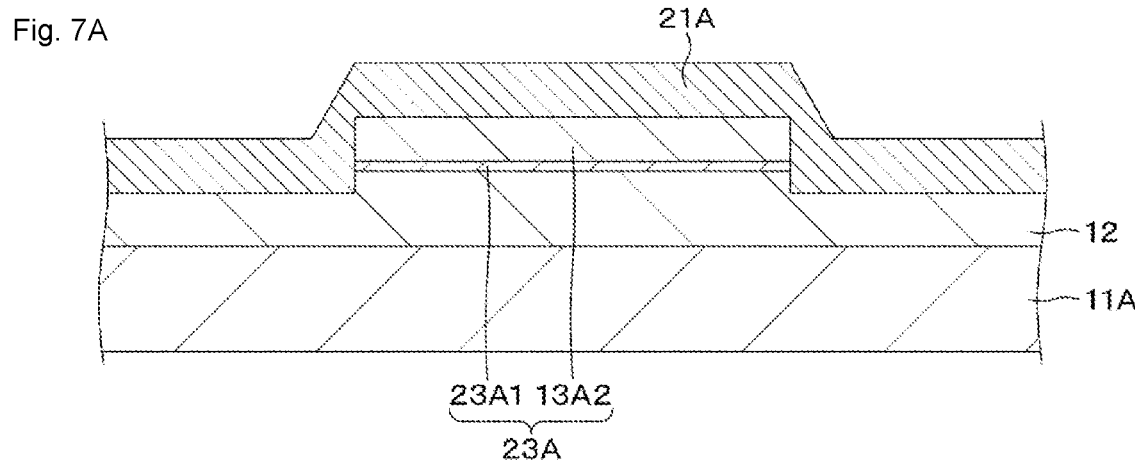
FIGS. 7A, 7B, and 7C are process diagrams for explaining an example of a method for manufacturing a display device according to the second embodiment of the present disclosure.
Figure 7B:
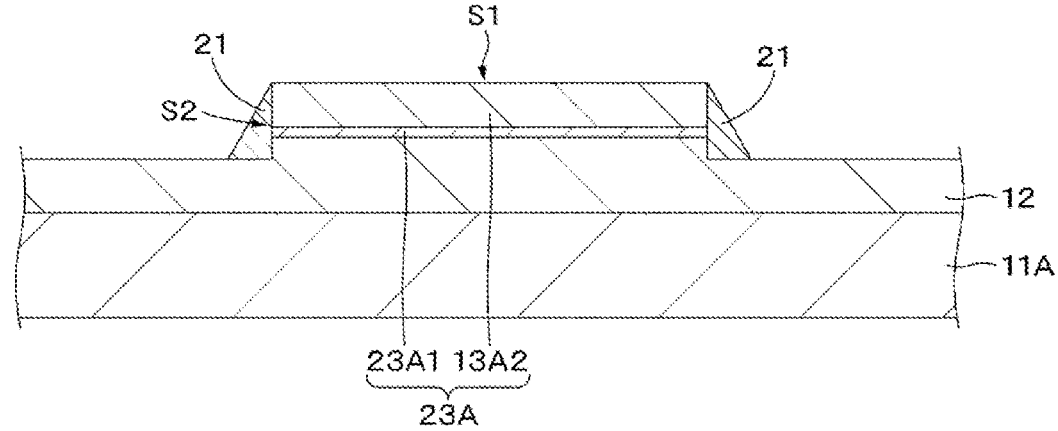
Figure 7C:
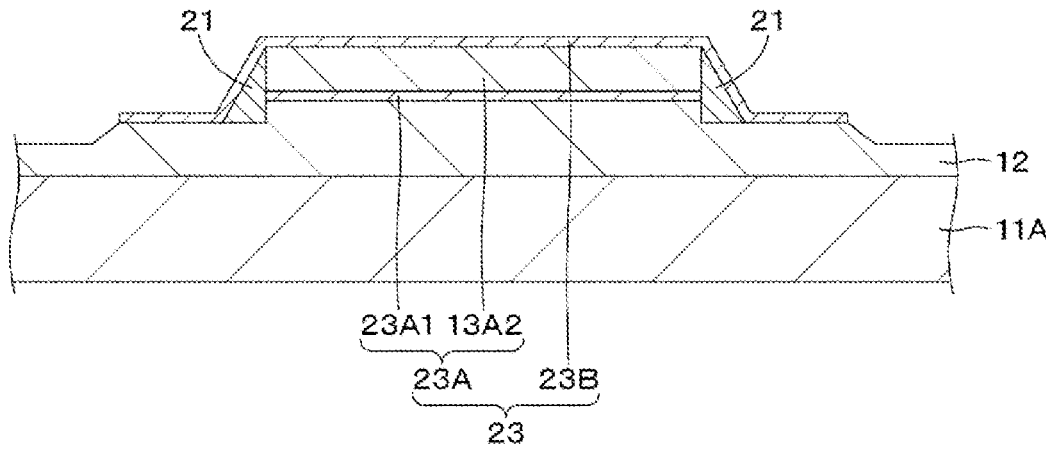

Next, an insulating layer 21A is formed on the first surface of the first insulating layer 12 so as to cover the plurality of metal layers 23A by, for example, CVD (see FIG. 7A). After that, by etching back the insulating layer 21A, the sidewall 21 is formed on the side surface S2 of each metal layer 23A (see FIG. 7B). By forming the sidewall 21 on the side surface S2 of each metal layer 23A in this way, it is possible to suppress contact between the peripheral edge of the first metal layer 23A1 and the transparent electrode 23B in a later step.

Next, a transparent electrode 23B is formed on the first surface of the first insulating layer 12 so as to cover the plurality of metal layers 23A and the plurality of sidewalls 21 by sputtering, for example. Next, after forming a resist mask having a predetermined pattern on the first surface of the transparent electrode 23B, the transparent electrode 23B is patterned by dry-etching the transparent electrode 23B through the resist mask. In this way, a plurality of first electrodes 23 is formed on the first surface of the first insulating layer 12 (see FIG. 7C).

Subsequent steps are performed in the same manner as in the manufacturing method of the display device 10 of the first embodiment. In this way, the display device 20 shown in FIG. 6 is obtained.

In the manufacturing method described above, the sidewalls 21 are formed from the insulating layer 21A. However, the manufacturing method of the display device 20 is not limited to this. A metal layer may be used instead of the insulating layer 21A, and the sidewalls 21 may be formed from the metal layer.

2.3 Operation and Effect

In the display device 20 according to the second embodiment, the sidewall 21 covers the side surface S2 of the metal layer 23A, and the sidewall 21 is sandwiched between the peripheral edge of the first metal layer 23A1 and the transparent electrode 23B. As a result, since the peripheral edge of the first metal layer 23A1 can be separated from the transparent electrode 23B, deterioration in reliability of the display device 20 can be suppressed. The occurrence of abnormal light emission can be suppressed.

3 Third Embodiment

3.1 Configuration of Display Device

Figure 8:
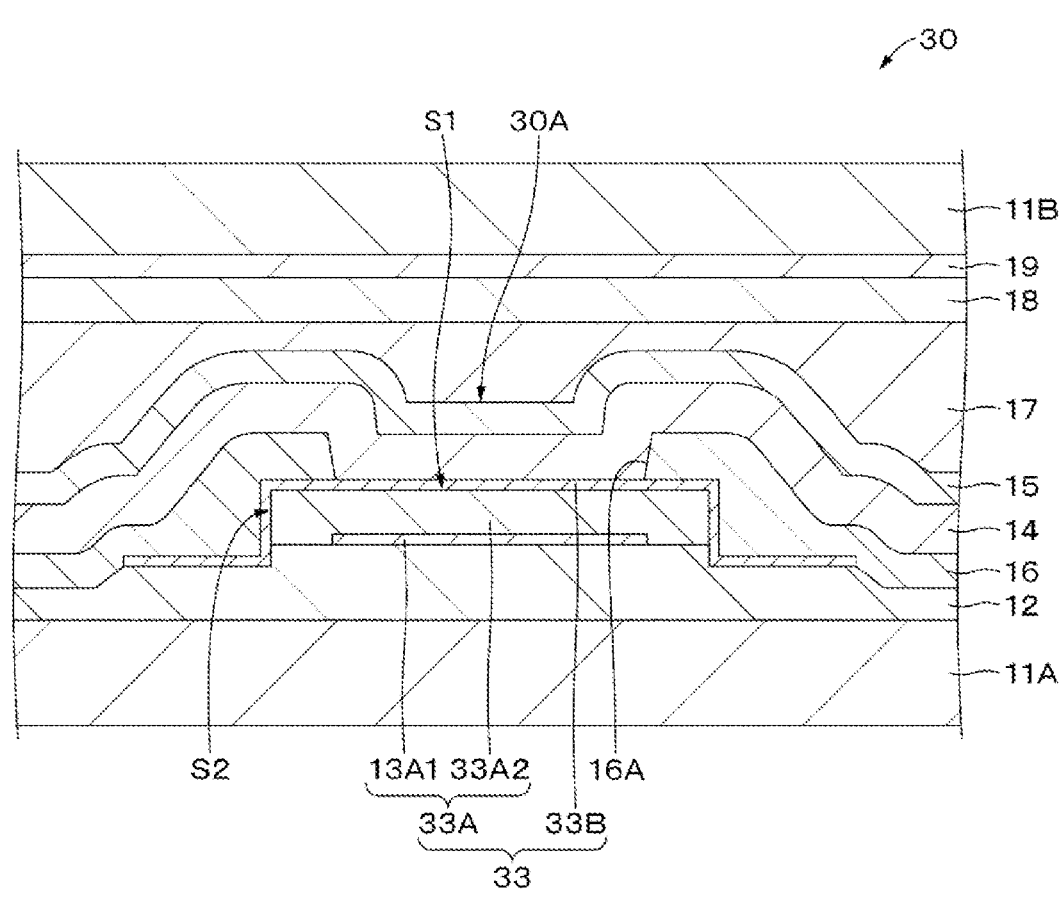
FIG. 8 is a cross-sectional view showing an example configuration of a display device according to a third embodiment of the present disclosure.

FIG. 8 is a cross-sectional view showing an example of the configuration of a display device 30 according to a third embodiment of the present disclosure. The display device 30 includes a first electrode 33 instead of the first electrode 13 (see FIG. 2A) in the first embodiment. The first electrode 33, the organic layer 14, and the second electrode 15 constitute a light-emitting element 30A. In the third embodiment, the same parts as those in the first embodiment are denoted by the same reference numerals, and descriptions thereof will be omitted.

(First Electrode)

The first electrode 23 includes a metal layer 33A and a transparent electrode 33B. The metal layer 33A includes a first metal layer 13A1 and a second metal layer 33A2. The peripheral edge of the second metal layer 33A2 is positioned on the outer side than the peripheral edge of the first metal layer 13A1. The second metal layer 33A2 covers the side surface of the first metal layer 13A1. The transparent electrode 33B covers the first surface (main surface) S1 of the second metal layer 33A2 and the side surface S2 of the second metal layer 33A2.

3.2 Manufacturing Method of Display Device

An example of a method for manufacturing the display device 30 according to the third embodiment of the present disclosure will be described below with reference to FIGS. 9A, 9B, and 9C.

First, the steps up to the formation of the first insulating layer 12 are performed in the same manner as in the method of manufacturing the display device 10 according to the first embodiment. Next, a first metal layer 13A1 is formed on the first surface of the first insulating layer 12. Next, after forming a resist mask having a predetermined pattern on the first surface of the first metal layer 13A1, the first metal layer 13A1 is patterned by dry-etching the first metal layer 13A1 through the resist mask. In this way, a plurality of first metal layers 13A1 are formed on the first surface of the first insulating layer 12 (see FIG. 9A).

Next, a second metal layer 33A2 is formed on the first surface of the first insulating layer 12 so as to cover the plurality of first metal layers 13A1 by sputtering. Next, after forming a resist mask having a predetermined pattern on the first surface of the second metal layer 33A2, the second metal layer 33A2 is patterned by dry-etching the second metal layer 33A2 through the resist mask. In this way, a plurality of metal layers 33A are formed on the first surface of the first insulating layer 12 (see FIG. 9B).

Next, a transparent electrode 33B is formed on the first surface of the first insulating layer 12 so as to cover the plurality of metal layers 33A by, for example, sputtering. Next, after forming a resist mask having a predetermined pattern on the first surface of the transparent electrode 33B, the transparent electrode 33B is patterned by dry-etching the transparent electrode 33B through the resist mask. In this way, a plurality of first electrodes 33 are formed on the first surface of the first insulating layer 12 (see FIG. 9C).

Subsequent steps are performed in the same manner as in the manufacturing method of the display device 10 of the first embodiment. As described above, the display device 30 shown in FIG. 8 is obtained.

3.3 Operation and Effect

In the display device 30 according to the third embodiment, the peripheral edge of the second metal layer 33A2 is positioned on the outer side than the peripheral edge of the first metal layer 13A1, and the second metal layer 33A2 covers the side surface of the first metal layer 13A1. As a result, part of the second metal layer 33A2 can be interposed between the peripheral edge of the first metal layer 13A1 and the transparent electrode 33B, and the peripheral edge of the first metal layer 13A1 can be separated from the transparent electrode 33B. Therefore, deterioration in reliability of the display device 30 can be suppressed. The occurrence of abnormal light emission can be suppressed.

4 Modification Examples

Modification Example 1

Figure 10:
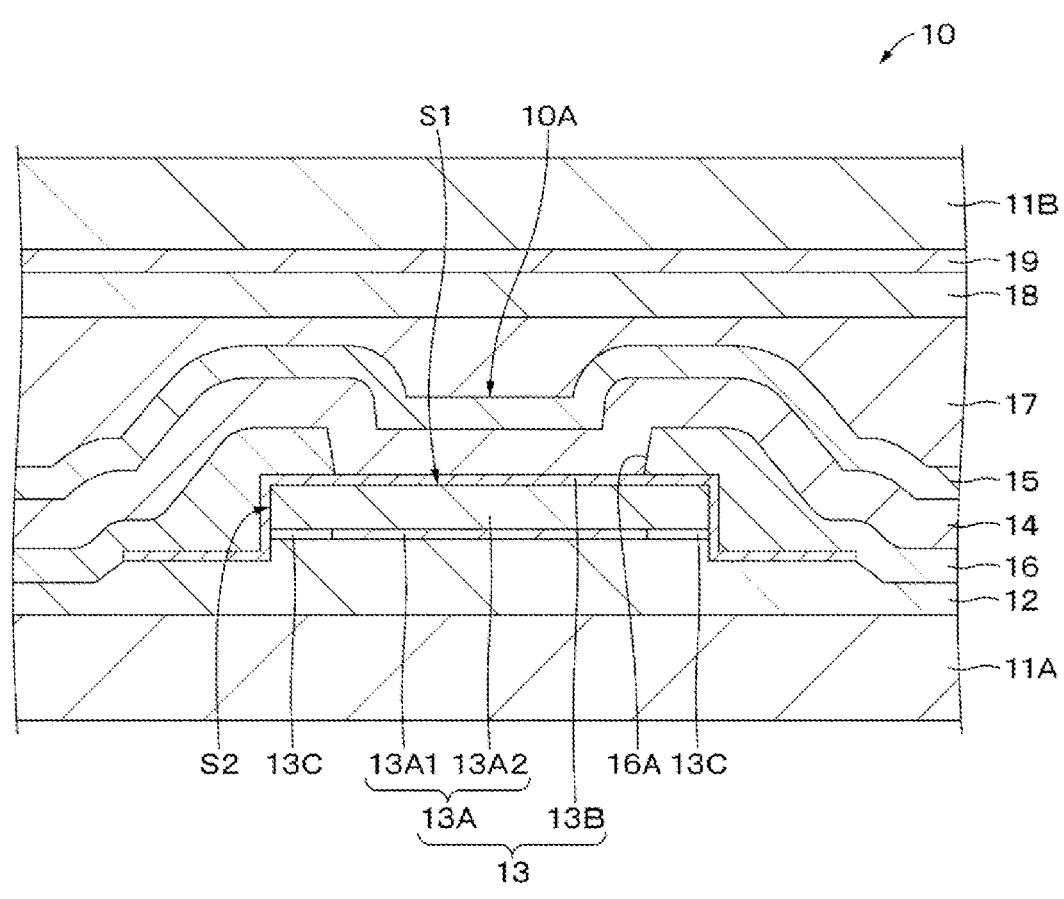
FIG. 10 is a cross-sectional view showing an example of the configuration of a display device according to a modification example of the first embodiment of the present disclosure.

In the first embodiment, the configuration in which the transparent electrode 13B is divided by the gap 13C (see FIG. 2A) has been described, but the transparent electrode 13B may cover the gap 13C as shown in FIG. 10. In this case, the gap 13C may be hollow, or an insulating layer or a metal layer may be provided in the gap 13C. Note that FIG. 10 shows an example in which the gap 13C is hollow.

Modification Example 2

In the first to third embodiments, an example in which the present disclosure is applied to a display device has been described, but the present disclosure is not limited to this, and can be applied to light-emitting devices other than display devices. Examples of light-emitting devices other than display devices include, but are not limited to, lighting devices. In this case, the number of light-emitting elements included in the light-emitting device such as the lighting device may be plural or singular.

5 Test Example

As described below, samples were prepared by forming a transparent conductive oxide layer (ITO layer, IZO layer, IGZO layer) on a Ti layer, and occurrence of moisture due to oxidation-reduction reaction was evaluated using these prepared samples.

[Sample 1-1]

Sample 1-1 was obtained by forming an ITO layer on a hydrogen-absorbed Ti layer by a sputtering method.

[Sample 1-2]

Sample 1-2 was obtained by forming an IZO layer on a hydrogen-absorbed Ti layer by a sputtering method.

[Sample 1-3]

Sample 1-3 was obtained by forming an IGZO layer on a hydrogen-absorbed Ti layer by a sputtering method.

[Sample 1-4]

A hydrogen-absorbed Ti layer was used as sample 1-4.

(TDS Evaluation)

Figure 11A:
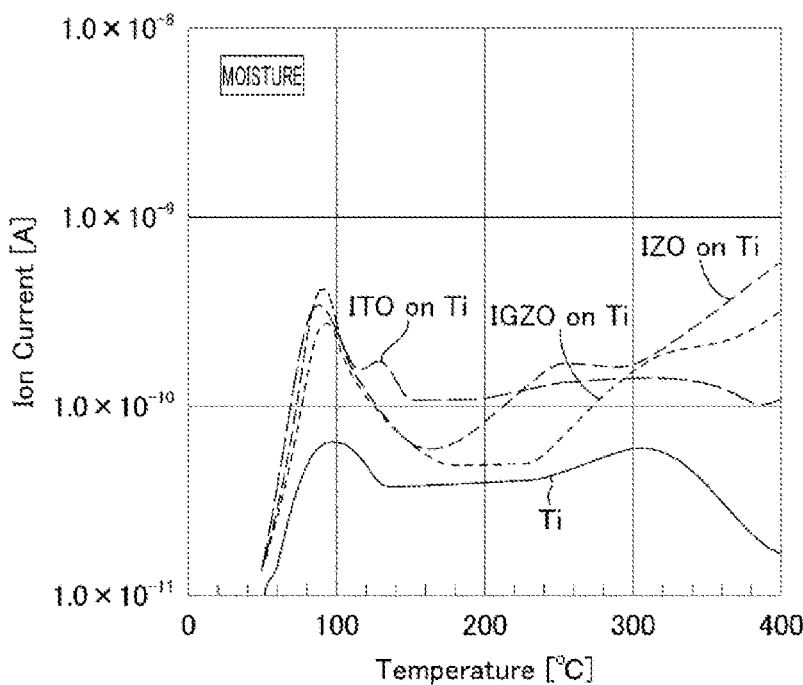
FIG. 11A is a diagram showing TDS spectra when measuring thermal desorption of moisture from samples 1-1 to 1-4.

Thermal desorption of moisture from samples 1-1 to 1-4 was measured by TDS (Thermal Desorption Spectrometry). FIG. 11A shows the TDS spectra resulting from this measurement.

It can be seen from FIG. 11A that when the samples 1-1 to 1-3 in which the metal layer in which hydrogen is absorbed and the transparent conductive oxide layer (transparent electrode) are in contact are heated, moisture is generated.

As described below, samples were prepared by forming a thin film on a Si substrate, and the desorption amount of hydrogen was evaluated using these prepared samples.

[Sample 2-1]

Sample 2-1 was obtained by forming a Ti layer on a Si substrate by a sputtering method.

[Sample 2-2]

Sample 2-2 was obtained by forming an AlO layer on a Si substrate by an ALD (Atomic Layer Deposition) method.

[Sample 2-3]

Sample 2-3 was obtained by forming a SiCO layer on a Si substrate by plasma CVD.

[Sample 2-4]

Sample 2-4 was obtained by forming an AlO layer on a Si substrate by a sputtering method.

(TDS Evaluation)

Figure 11B:
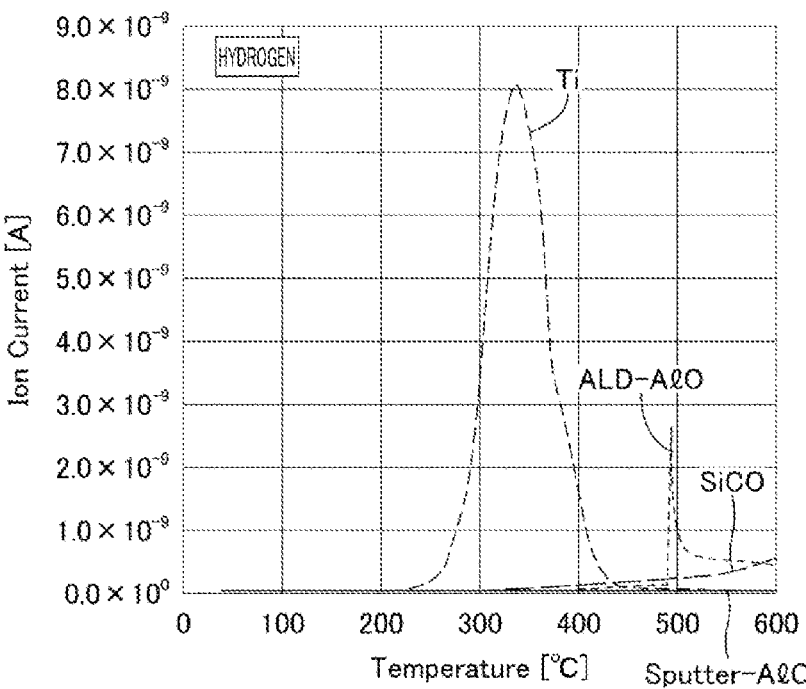
FIG. 11B is a diagram showing TDS spectra when measuring thermal desorption of hydrogen from samples 2-1 to 2-4.

The desorption amount of hydrogen from samples 2-1 to 2-4 was measured by TDS. FIG. 11B shows the TDS spectra resulting from this measurement.

It can be seen from FIG. 11B that the amount of desorption of hydrogen from the Ti layer is the largest among the evaluation thin films. From this result, it is presumed that the amount of moisture generated is particularly large when the Ti layer and the transparent conductive oxide layer (transparent electrode) are in contact with each other.

6 Application Example (Electronic Apparatus)

Figure 12:
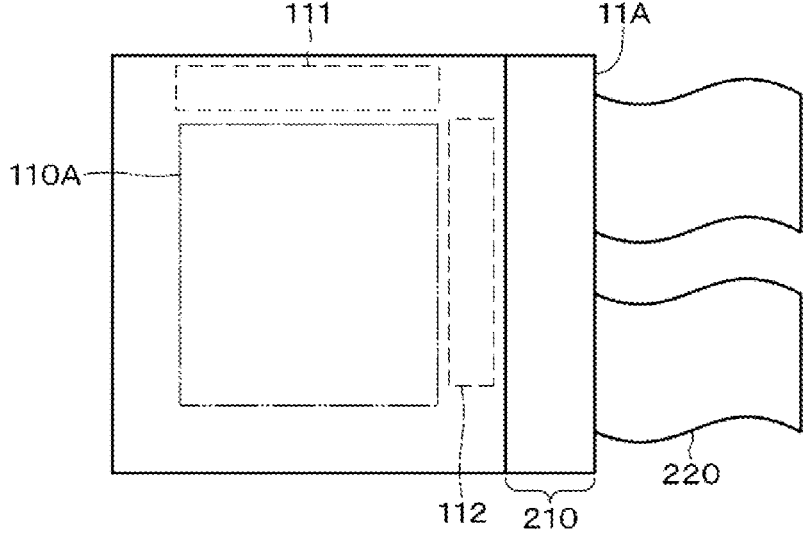
FIG. 12 is a plan view showing an example of the schematic configuration of the module.

The display devices 10, 20, and 30 according to the above-described first to third embodiments and modification examples thereof can be used in various electronic apparatuses. The display devices 10, 20 and 30 are incorporated into various electronic apparatuses as modules as shown in FIG. 12, for example. In particular, the display devices are suitable for electronic viewfinders of video cameras or single-lens reflex cameras, head-mounted displays, or the like, which require high resolution and are used in close proximity to the eyes. This module has an exposed region 210 that is not covered with the counter substrate 11B or the like on one short side of the driving substrate 11A, and wiring of the signal line driving circuit 111 and the scanning line driving circuit 112 is extended so that an external connection terminal (not shown) is formed in this region 210. A flexible printed circuit (FPC) 220 for signal input/output may be connected to the external connection terminal.

Specific Example 1

Figure 13A:
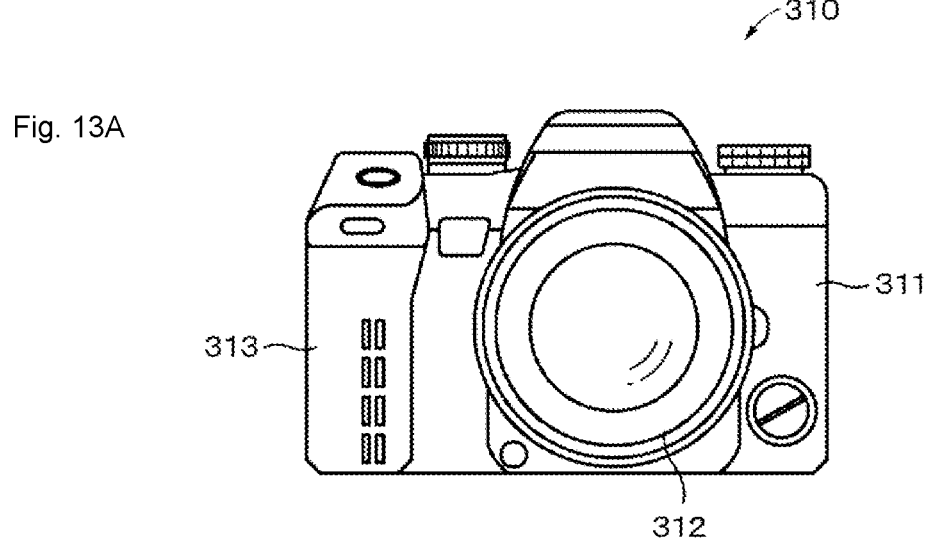
FIG. 13A is a front view showing an example of the appearance of a digital still camera.
Figure 13B:
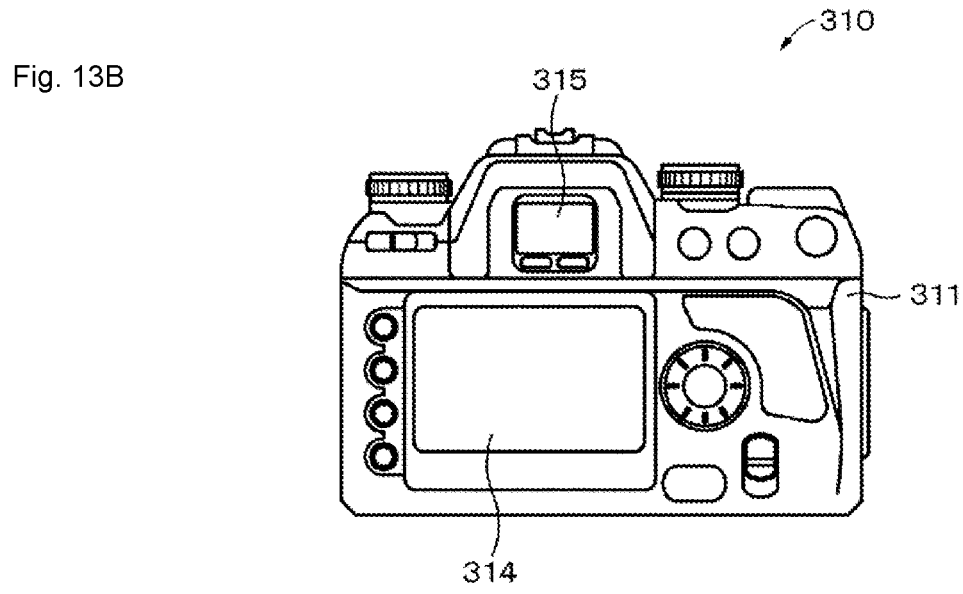
FIG. 13B is a rear view showing an example of the appearance of the digital still camera.

FIGS. 13A and 13B show an example of the appearance of a digital still camera 310. This digital still camera 310 is an interchangeable single-lens reflex-type camera, and has an interchangeable photographing lens unit (interchangeable lens) 312 in approximately the center of the front surface of a camera main body (camera body) 311, and has a grip portion 313 for a photographer to hold on the left side of the front surface.

A monitor 314 is provided at a position shifted to the left from the center of the rear side of the camera main unit 311. On the monitor 314, an electronic viewfinder (eyepiece window) 315 is provided. Viewing through the electronic viewfinder 315 allows the photographer to visually recognize an optical subject image guided from the photographing lens unit 312 and determine the composition. As the electronic viewfinder 315, any one of the display devices 10, 20, and 30 can be used.

Specific Example 2

Figure 14:
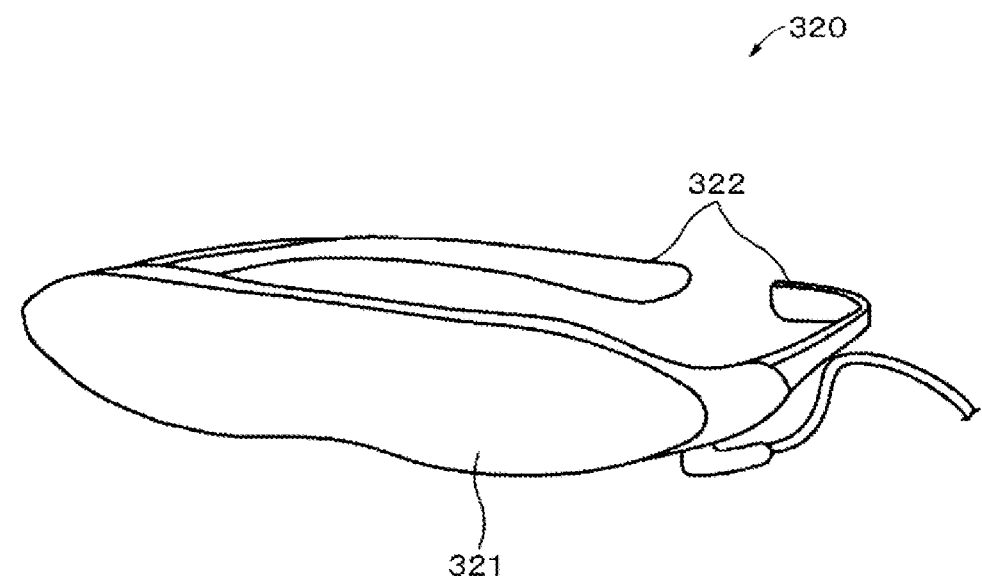
FIG. 14 is a perspective view of an example of the appearance of a head-mounted display.

FIG. 14 shows an example of the appearance of a head-mounted display 320. The head-mounted display 320 has, for example, ear hooks 322 on both sides of an eyeglass-shaped display unit 321 to be worn on the user's head. As the display unit 321, any one of the display devices 10, 20, and 30 can be used.

Specific Example 3

Figure 15:
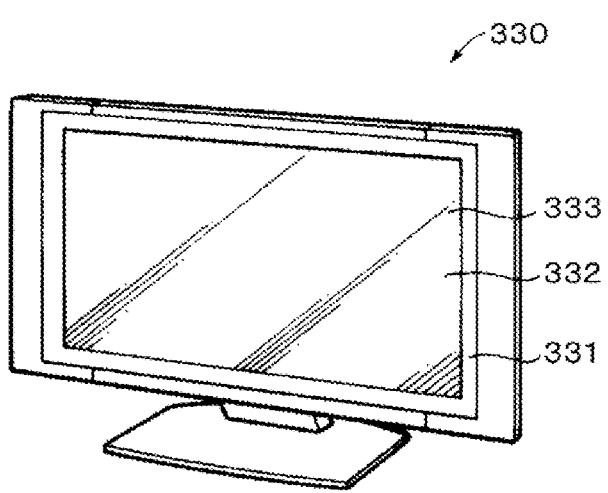
FIG. 15 is a perspective view showing an example of the appearance of a television device.

FIG. 15 shows an example of the appearance of a television device 330. This television device 330 has, for example, a video display screen portion 331 including a front panel 332 and a filter glass 333. The video display screen portion 331 is configured by any one of the display devices 10, 20, and 30.

Although the first to third embodiments of the present disclosure and the modification examples thereof have been specifically described above, the present disclosure is not limited to the above-described first to third embodiments and the modification examples thereof, and various modifications based on the technical idea of the present disclosure are possible.

For example, the configurations, methods, processes, shapes, materials, numerical values, and the like given in the above-described first to third embodiments and the modification examples thereof are merely examples, and different configurations, methods, processes, shapes, materials, numerical values, and the like may be used, if necessary.

In addition, the configurations, methods, processes, shapes, materials, numerical values, and the like in the first to third embodiments and the modification examples thereof described above can be combined with each other without departing from the gist of the present disclosure.

The materials exemplified in the above-described first to third embodiments and the modification examples thereof may be used singly or in combination of two or more unless otherwise specified.

In addition, the present disclosure may have the following constitutions.

A display device including: a plurality of first electrodes; a second electrode facing the plurality of first electrodes; and an organic light-emitting layer provided between the plurality of first electrodes and the second electrode, wherein each of the first electrode includes: a metal layer having a main surface facing the organic light-emitting layer; and a transparent electrode covering a main surface of the metal layer and a side surface of the metal layer and containing a transparent conductive oxide, the metal layer includes: a first metal layer having a hydrogen absorption capacity; and a second metal layer provided on the first metal layer and facing the organic light-emitting layer with the transparent electrode interposed therebetween, and a peripheral edge of the first metal layer is separated from the transparent electrode.

(2) The display device according to (1), wherein the first metal layer contains at least one selected from the group consisting of titanium (Ti) and tantalum (Ta).

(3) The display device according to (1) or (2), wherein a peripheral edge of the first metal layer is positioned on an inner side of a peripheral edge of the second metal layer.

(4) The display device according to (3), wherein a gap is provided on an outer side of a side surface of the first metal layer.

(5) The display device according to (4), wherein an insulating layer or a metal layer is provided in the gap.

(6) The display device according to (4), wherein the gap is hollow.

(7) The display device according to any one of (1) to (3), wherein the second metal layer covers a side surface of the first metal layer.

(8) The display device according to any one of (1) to (7), further including a sidewall provided between a side surface of the metal layer and the transparent electrode.

(9) The display device according to (8), wherein the sidewall has lower hydrogen absorption capacity than the first metal layer.

(10) The display device according to (8), wherein the sidewall does not have hydrogen absorption capacity.

(11) The display device according to any one of (8) to (10), wherein the sidewall contains at least one selected from the group consisting of metals and insulating materials.

(12) The display device according to any one of (1) to (11), further including an insulating layer having a plurality of openings, wherein the first electrode is exposed from the opening, and a peripheral edge of the first metal layer is positioned on an outer side of a peripheral edge of the opening.

(13) The display device according to any one of (1) to (12), wherein the second metal layer contains at least one selected from the group consisting of aluminum (Al) and silver (Ag).

(14) The display device according to any one of (1) to (13), wherein the transparent conductive oxide contains at least one selected from the group consisting of a transparent conductive oxide containing indium, a transparent conductive oxide containing tin, and a transparent conductive oxide containing zinc.

(15) A light-emitting device including: a first electrode; a second electrode facing the first electrode; and an organic light-emitting layer provided between the first electrode and the second electrode, wherein the first electrode includes: a metal layer having a main surface facing the organic light-emitting layer; and a transparent electrode covering a main surface of the metal layer and a side surface of the metal layer and containing a transparent conductive oxide, the metal layer includes: a first metal layer having a hydrogen absorption capacity; and a second metal layer provided on the first metal layer and facing the organic light-emitting layer with the transparent electrode interposed therebetween, and a peripheral edge of the first metal layer is separated from the transparent electrode.

(16) An electronic apparatus including the display device according to any one of (1) to (14).

REFERENCE SIGNS LIST

10, 20, 30, 410 Display device (light-emitting device)
10A, 20A, 30A Light-emitting element
11A Driving substrate
11B Counter substrate
12 First insulating layer
13, 23, 33, 413 First electrode
13A, 23A, 33A, 413A Metal layer
13A1, 23A1, 413A1 First metal layer
13A2, 33A2 Second metal layer
13B, 23B, 33B, 413B Transparent electrodes
14 Organic layer
15 Second electrode
16 Second insulating layer
16A Opening
17 Protective layer
18 Color filter
19 Filling resin layer
21 Sidewall
21A Insulating layer
100R, 100G, 100B Sub-pixel
110A Display region
110B Peripheral region
111 Signal line driving circuit
111A Signal line
112 Scanning line driving circuit
112A Scanning line
310 Digital still camera (Electronic apparatus)
320 Head-mounted display (Electronic apparatus)
330 Television device (Electronic apparatus)

The invention claimed is:

1. A display device, comprising:
a plurality of first electrodes;
a second electrode that faces the plurality of first electrodes; and
an organic light-emitting layer between the plurality of first electrodes and the second electrode, wherein
each electrode of the plurality of first electrodes includes:
a transparent that includes a transparent conductive oxide;
a first metal layer having a hydrogen absorption capacity; and
a second metal layer on the first metal layer, the second metal layer includes a plurality of surfaces, a first surface of the plurality of surfaces faces the organic light-emitting layer, the transparent electrode covers the first surface and side surfaces of the plurality of surfaces of the second metal layer in entirety, a portion of a second surface of the plurality of surfaces of the second metal layer is in contact with the first metal layer, the transparent electrode is between the second metal layer and the organic light-emitting layer, and a peripheral edge of the first metal layer is separated from the transparent electrode.

2. The display device according to claim 1, wherein the first metal layer contains at least one of titanium (Ti) or tantalum (Ta).

3. The display device according to claim 1, wherein the peripheral edge of the first metal layer is on an inner side of a peripheral edge of the second metal layer.

4. The display device according to claim 3, wherein an outer side of a side surface of the first metal layer includes a gap.

5. The display device according to claim 4, wherein the gap includes one of an insulating layer or a metal layer.

6. The display device according to claim 4, wherein the gap is hollow.

7. The display device according to claim 1, further comprising a sidewall between the side surfaces of the second metal layer and the transparent electrode.

8. The display device according to claim 7, wherein the sidewall has lower hydrogen absorption capacity than the first metal layer.

9. The display device according to claim 7, wherein the sidewall does not have hydrogen absorption capacity.

10. The display device according to claim 7, wherein the sidewall contains at least one of metals or insulating materials.

11. The display device according to claim 1, further comprising an insulating layer having a plurality of openings, the plurality of first electrodes is exposed from the plurality of openings, and the peripheral edge of the first metal layer is on an outer side of a peripheral edge of an opening of the plurality of openings.

12. The display device according to claim 1, wherein the second metal layer contains at least one of aluminum (Al) or silver (Ag).

13. The display device according to claim 1, wherein the transparent conductive oxide contains at least one of a transparent conductive oxide containing indium, a transparent conductive oxide containing tin, or a transparent conductive oxide containing zinc.

14. A light-emitting device, comprising:

a first electrode;

a second electrode that faces the first electrode; and an organic light-emitting layer between the first electrode and the second electrode, wherein the first electrode includes:

a transparent electrode that includes a transparent conductive oxide; and a first metal layer having a hydrogen absorption capacity; and a second metal layer on the first metal layer, the second metal layer includes a plurality of surfaces, a first surface of the plurality of surfaces faces the organic light-emitting layer, the transparent electrode covers the first surface and side surfaces of the plurality of surfaces of the second metal layer in entirety, a portion of a second surface of the plurality of surfaces of the second metal layer is in contact with the first metal layer, the transparent electrode is between the second metal layer and the organic light-emitting layer, and a peripheral edge of the first metal layer is separated from the transparent electrode.

15. An electronic apparatus, comprising:

a display device that includes:

a plurality of first electrodes;

a second electrode that faces the plurality of first electrodes; and an organic light-emitting layer between the plurality of first electrodes and the second electrode, wherein each electrode of the plurality of first electrodes includes:

a transparent electrode that includes a transparent conductive oxide;

a first metal layer having a hydrogen absorption capacity; and a second metal layer on the first metal layer, the second metal layer includes a plurality of surfaces, a first surface of the plurality of surfaces faces the organic light-emitting layer the transparent electrode covers the first surface and side surfaces of the plurality of surfaces of the second metal layer in entirety, a portion of a second surface of the plurality of surfaces of the second metal layer is in contact with the first metal layer, the transparent electrode is between the second metal layer and the organic light-emitting layer, and a peripheral edge of the first metal layer is separated from the transparent electrode.

* * * * *